United States Patent
Hamano et al.

(10) Patent No.: US 10,707,075 B2
(45) Date of Patent: Jul. 7, 2020

(54) SEMICONDUCTOR WAFER, SEMICONDUCTOR DEVICE, AND METHOD FOR PRODUCING SEMICONDUCTOR DEVICE

(71) Applicant: Mitsubishi Electric Corporation, Tokyo (JP)

(72) Inventors: Kenichi Hamano, Tokyo (JP); Akihito Ohno, Tokyo (JP); Takuma Mizobe, Tokyo (JP); Masashi Sakai, Tokyo (JP); Yasuhiro Kimura, Tokyo (JP); Yoichiro Mitani, Tokyo (JP); Takashi Kanazawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/316,120

(22) PCT Filed: Nov. 28, 2016

(86) PCT No.: PCT/JP2016/085223
§ 371 (c)(1),
(2) Date: Jan. 8, 2019

(87) PCT Pub. No.: WO2018/096684
PCT Pub. Date: May 31, 2018

(65) Prior Publication Data
US 2020/0144053 A1 May 7, 2020

(51) Int. Cl.
*H01L 21/02* (2006.01)
*H01L 29/16* (2006.01)
(Continued)

(52) U.S. Cl.
CPC ........ *H01L 21/02447* (2013.01); *C30B 25/20* (2013.01); *C30B 29/36* (2013.01);
(Continued)

(58) Field of Classification Search
CPC ......... H01L 21/02378; H01L 21/02477; H01L 21/02529; H01L 29/1608; H01L 29/36
See application file for complete search history.

(56) References Cited

U.S. PATENT DOCUMENTS 9,601,639 B2 * 3/2017 Masuoka ............ H01L 29/0692
10,415,154 B2 * 9/2019 Nakamura ........ H01L 29/66068
(Continued)

FOREIGN PATENT DOCUMENTS

JP 2000-319099 11/2000

OTHER PUBLICATIONS

International Search Report; Written Opinion; and Notification of Transmittal of the International Search Report and the Written Opinion of the International Searching Authority, or the Declaration issued in PCT/JP2016/085223; dated Jan. 10, 2017.

*Primary Examiner* — Daniel Luke
(74) *Attorney, Agent, or Firm* — Studebaker & Brackett PC

(57) ABSTRACT

A semiconductor wafer includes a silicon carbide substrate having a first carrier concentration, a carrier concentration transition layer, and an epitaxial layer provided on the carrier concentration transition layer, the epitaxial layer having a second carrier concentration, and the second carrier concentration being lower than the first carrier concentration. The carrier concentration transition layer has a concentration gradient in the thickness direction. The carrier concentration decreases as the film thickness increases from an interface between a layer directly below the carrier concentration transition layer and the carrier concentration transition layer, and the carrier concentration decreases at a lower rate of decrease as the film thickness of the carrier concentration transition layer increases. The carrier concentration of the carrier concentration transition layer has the concentration gradient that falls within a predetermined concentration (Continued)

range lying between a first concentration gradient condition and a second concentration gradient condition.

20 Claims, 6 Drawing Sheets

(51) Int. Cl.
   *H01L 29/36* (2006.01)
   *C30B 25/20* (2006.01)
   *H01L 29/872* (2006.01)
   *C30B 29/36* (2006.01)
(52) U.S. Cl.
   CPC .. *H01L 21/02378* (2013.01); *H01L 21/02529* (2013.01); *H01L 21/02576* (2013.01); *H01L 29/1608* (2013.01); *H01L 29/36* (2013.01); *H01L 29/872* (2013.01)

(56) References Cited

U.S. PATENT DOCUMENTS

2012/0199848 A1\* 8/2012 Ito ................... H01L 21/02447
                                                            257/77
2019/0013198 A1\* 1/2019 Itoh ..................... H01L 29/167

\* cited by examiner

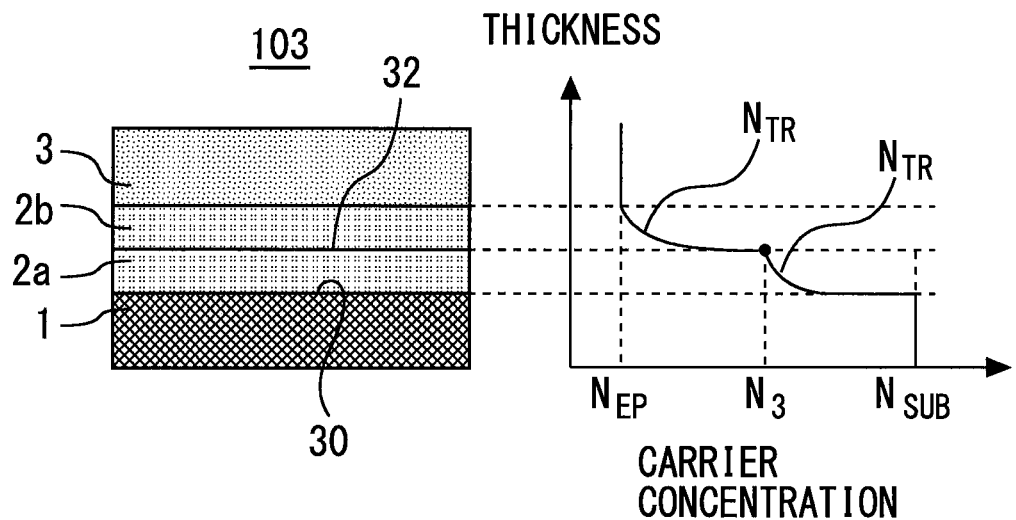
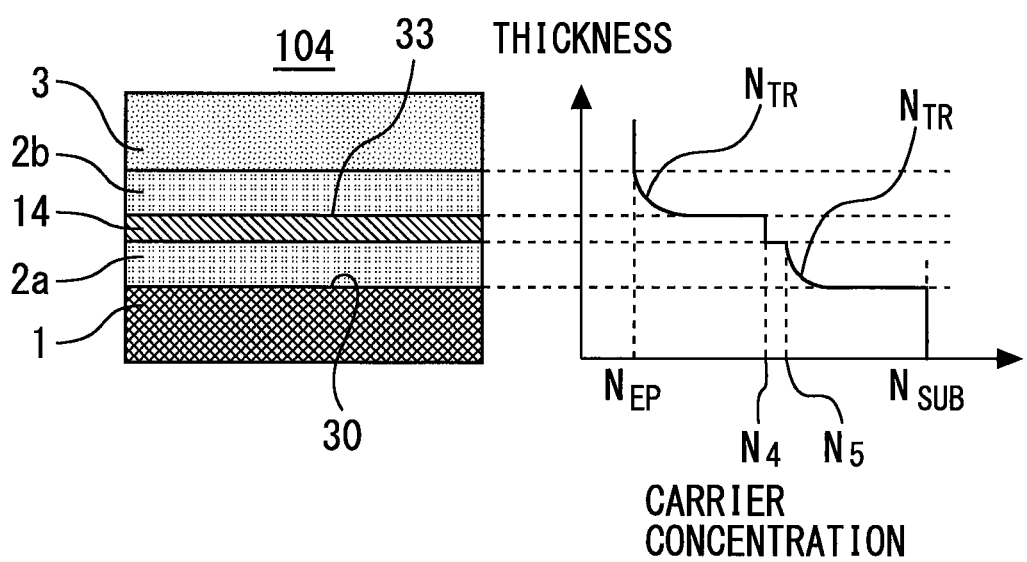
Fig. 8

SEMICONDUCTOR WAFER, SEMICONDUCTOR DEVICE, AND METHOD FOR PRODUCING SEMICONDUCTOR DEVICE

FIELD

The present application relates to a semiconductor wafer, a semiconductor device, and a method for producing a semiconductor device.

BACKGROUND

Silicon carbide is expected as a next-generation power semiconductor material. An epitaxial layer made to grow on a silicon carbide substrate includes, specifically, a drift layer which becomes a breakdown-voltage holding layer of a power device. In the case of N-type silicon carbide, the power device silicon carbide substrate generally has a carrier concentration on the order of $10^{18}$ to $10^{19}$ cm$^{-3}$. In contrast, the drift layer has a carrier concentration on the order of $10^{15}$ to $10^{16}$ cm$^{-3}$. Therefore, for power device applications, the silicon carbide substrate normally has a carrier concentration about 10 times to 1000 times higher than the carrier concentration of the drift layer. A lattice constant of silicon carbide is dependent on its carrier concentration. More specifically, the higher the carrier concentration, the smaller the lattice constant becomes. Due to a difference in carrier concentration, compression stress is applied to the epitaxial layer at the interface between the epitaxial layer such as the drift layer and the silicon carbide substrate. The stress may cause a dislocation or crystal defect failure in the epitaxial layer. Degradation of crystal quality may hamper carrier movement, causing deterioration of device characteristics.

As a solution to the above-described problem, a technique is known which causes a buffer layer to epitaxially grow on the silicon carbide substrate and then causes the drift layer to epitaxially grow on the buffer layer. Thus, a buffer layer having an intermediate carrier concentration can be provided between the silicon carbide substrate and the drift layer. For example, paragraph 0050 of JP 2000-319099 A discloses a technique which changes the carrier concentration of the buffer layer in a step form or provides a continuous and linear gradient in the carrier concentration of the buffer layer.

CITATION LIST

Patent Literature

[PTL 1] JP 2000-319099 A

SUMMARY

Technical Problem

In order to produce a desired semiconductor device, it is preferable that the film thickness of an epitaxial layer be managed accurately when the epitaxial layer to be used as a drift layer is produced. An FT-IR method is often used to manage the film thickness of the epitaxial layer. The FT-IR method is an abbreviation of a reflection interference analysis using a Fourier transform infrared spectrophotometer. A principle of the FT-IR method is as follows: when there is a difference equal to or higher than a predetermined level in a refractive index between substances, the film thickness is measured by taking advantage of the fact that infrared reflection is obtained at the interface between the two substances. In order to measure the thickness of the epitaxial layer using the FT-IR method, a certain degree of refractive index difference is required at the interface between a layer directly below the epitaxial layer and the epitaxial layer. It is not desirable to use a buffer layer having a linear carrier concentration gradient described in JP 2000-319099 A from the standpoint of achieving a sufficient refractive index difference. This is because when the linear carrier concentration gradient is provided, it is difficult to obtain a refractive index difference necessary to obtain infrared reflected light at the interface between the layer directly below the buffer layer and the buffer layer.

On the other hand, using the buffer layer having a stepped carrier concentration gradient described in JP 2000-319099 A is not preferable either. Since the carrier concentration discontinuously changes in the case of the stepped carrier concentration gradient, it may be impossible to sufficiently suppress dislocations and crystal defect failures at the interface between the buffer layer and the silicon carbide substrate. Furthermore, from the standpoint of production, crystal growth needs to be suspended in order to produce a buffer layer having a stepped carrier concentration gradient or abrupt gas replacement is needed. As a result, the crystal defect failure of the buffer layer may increase due to the occurrence of turbulence accompanying the gas replacement.

The present application has been implemented to solve the above-described problems and it is an object of the present application to provide a semiconductor wafer, a semiconductor device, and a method for producing a semiconductor device improved so as to achieve both accurate film thickness management and crystallinity.

Solution to Problem

A semiconductor wafer according to the present application is provided with a silicon carbide substrate having a first carrier concentration which is uniform in a thickness direction, a carrier concentration transition layer provided on the silicon carbide substrate, and an epitaxial layer provided on the carrier concentration transition layer, the epitaxial layer having a second carrier concentration which is uniform in the thickness direction and the second carrier concentration being lower than the first carrier concentration. The carrier concentration of the carrier concentration transition layer has a concentration gradient in the thickness direction. The concentration gradient is such a gradient that the carrier concentration decreases continuously as a distance along the thickness direction from an interface increases, the interface is provided between a layer directly below the carrier concentration transition layer and the carrier concentration transition layer, and the carrier concentration decreases at a lower rate of decrease as the distance from the interface along the thickness direction in the carrier concentration transition layer increases. X is assumed to be a film thickness ratio in the carrier concentration transition layer. The film thickness ratio is obtained by dividing a position in the thickness direction of the carrier concentration transition layer by a film thickness of the carrier concentration transition layer, and X is a variable having a domain of $0 \le X \le 1$. Y is assumed to be a carrier concentration ratio in the carrier concentration transition layer. The carrier concentration ratio is obtained by dividing a carrier concentration of the carrier concentration transition layer in a range of $0 < X \le 1$ by a carrier concentration of the carrier concentration transition layer when X=0. When a concentration range lying between the following equation (a1) and equation (a2) is defined in advance, the carrier concentration of the carrier concentration transition layer includes the concentration gradient that falls within the concentration range.

[Math. 1]

$$Y = \frac{1.05}{\sqrt{1.74 \times 10^{-3} + 1.00 \times X}} - 1.04 \qquad (a1)$$

[Math. 2]

$$Y = \frac{1.95}{\sqrt{1.11 \times 10^{-1} + 0.89 \times X}} - 1.50 \qquad (a2)$$

A semiconductor device according to the present application is provided with a silicon carbide substrate having a first carrier concentration which is uniform in a thickness direction, a carrier concentration transition layer provided on the silicon carbide substrate, and an epitaxial layer provided on the carrier concentration transition layer, the epitaxial layer having a second carrier concentration which is uniform in the thickness direction and the second carrier concentration being lower than the first carrier concentration. The carrier concentration of the carrier concentration transition layer of the semiconductor device according to the present application has the same concentration gradient that falls within the concentration range lying between the equation (a1) and the equation (a2) as the semiconductor wafer according to the present application.

A method for producing a semiconductor device according to the present application is provided with a first step of preparing a silicon carbide substrate having a first carrier concentration which is uniform in a thickness direction, a second step of providing a carrier concentration transition layer on the silicon carbide substrate by supplying a growth gas and a dopant gas and a third step of providing an epitaxial layer on the carrier concentration transition layer, the epitaxial layer having a second carrier concentration which is uniform in the thickness direction, and the second carrier concentration being lower than the first carrier concentration. The second step is configured to control flow rates of the growth gas and the dopant gas such that the carrier concentration of the carrier concentration transition layer has a concentration gradient in the thickness direction. The concentration gradient is such a gradient that the carrier concentration decreases continuously as a distance along the thickness direction from an interface increases, the interface is provided between a layer directly below the carrier concentration transition layer and the carrier concentration transition layer, and the carrier concentration decreases at a lower rate of decrease as the distance from the interface along the thickness direction in the carrier concentration transition layer increases. X is assumed to be a film thickness ratio in the carrier concentration transition layer. The film thickness ratio is obtained by dividing a thickness of the carrier concentration transition layer in the middle of growth after the carrier concentration transition layer starts to grow by a film thickness design value of the carrier concentration transition layer, and X is a variable having a domain of $0 \leq X \leq 1$. Y is assumed to be a carrier concentration ratio in the carrier concentration transition layer. The carrier concentration ratio is obtained by dividing a carrier concentration of the carrier concentration transition layer in a range of $0 < X \leq 1$ by a carrier concentration of the carrier concentration transition layer when $X=0$. When a concentration range lying between the following equation (c1) and equation (c2) is defined in advance, the second step is configured to control the flow rates of the growth gas and the dopant gas so that the carrier concentration of the carrier concentration transition layer includes the concentration gradient that falls within the concentration range.

[Math. 3]

$$Y = \frac{1.05}{\sqrt{1.74 \times 10^{-3} + 1.00 \times X}} - 1.04 \qquad (c1)$$

[Math. 4]

$$Y = \frac{1.95}{\sqrt{1.11 \times 10^{-1} + 0.89 \times X}} - 1.50 \qquad (c2)$$

Advantageous Effects of Invention

According to the present application, the carrier concentration of the carrier concentration transition layer is made to fall within an appropriate range in relation to the layer directly below the carrier concentration transition layer, and it is thereby possible to achieve both accurate film thickness management and excellent crystallinity.

BRIEF DESCRIPTION OF DRAWINGS

FIG. 7 is a partially enlarged view and a graph illustrating a carrier concentration distribution of the silicon carbide wafer according to modification to the embodiment of the present invention;

FIG. 8 is a partially enlarged view and a graph illustrating a carrier concentration distribution of the silicon carbide wafer according to modification to the embodiment of the present invention;

DESCRIPTION OF EMBODIMENTS

Wafer Structure According to Embodiment

Figure 1:
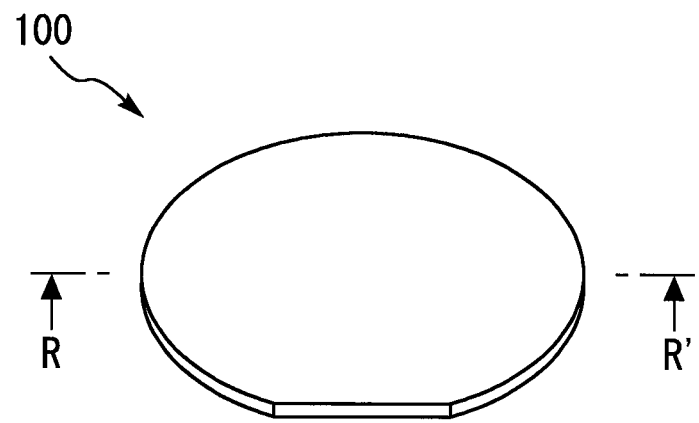
FIG. 1 is a perspective view illustrating a silicon carbide wafer according to an embodiment of the present invention.
Figure 2:
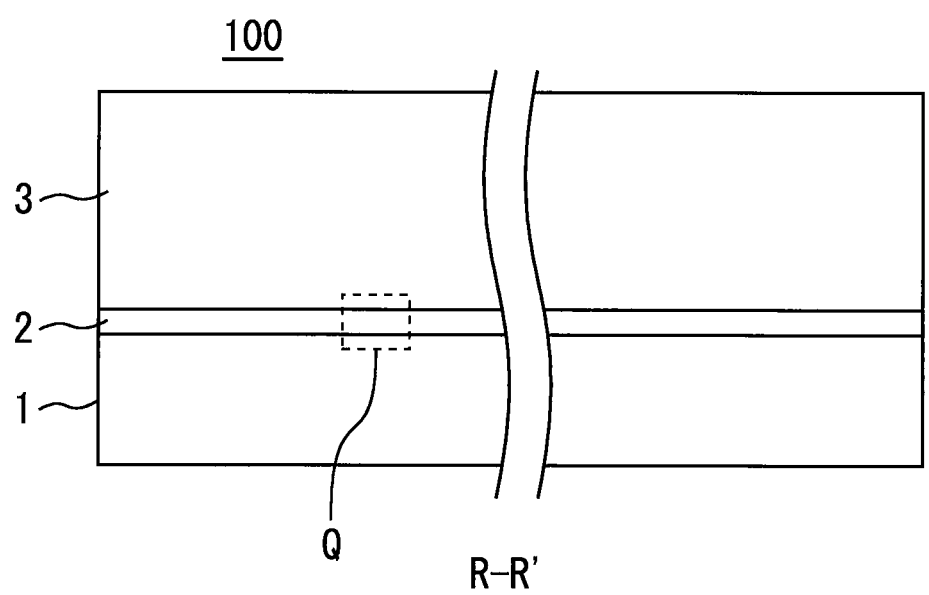
FIG. 2 is a cross-sectional view of the silicon carbide wafer according to the embodiment of the present invention.

FIG. 1 is a perspective view illustrating a silicon carbide wafer 100 according to an embodiment of the present invention. FIG. 2 is a cross-sectional view of the silicon carbide wafer 100 according to the embodiment of the present invention. FIG. 2 illustrates a plane of the silicon carbide wafer 100 cut along a line R-R' in FIG. 1. As shown in FIG. 2, the silicon carbide wafer 100 is constructed of an N-type silicon carbide substrate 1, a carrier concentration transition layer 2 which is an N-type epitaxial layer formed on the silicon carbide substrate 1 and an epitaxial layer 3 made to epitaxially grow on the carrier concentration transition layer 2. The epitaxial layer 3 is used as a drift layer in semiconductor devices 40 and 42 which will be described later.

Silicon carbide is known to have many crystal polymorphous forms and 4H-type silicon carbide is often used for power device applications. Since silicon carbide has many crystal polymorphous forms, a small amount of energy may transform silicon carbide into a different crystal polymorphous form. Thus, silicon carbide is generally made to carry out step flow growth in silicon carbide epitaxial growth on the silicon carbide substrate 1. In the step flow growth, a crystal is made to grow on the silicon carbide substrate 1, a substrate surface of which is inclined by 4 to 8° from a [0001] crystal axis, and a crystal polymorphous form of the epitaxial grown layer on the silicon carbide substrate 1 is kept identical to the silicon carbide substrate 1. More specifically, the silicon carbide substrate 1 according to the present embodiment has a gradient of 4° in a [11-20] direction from a (0001) surface.

The silicon carbide substrate 1 has a carrier concentration which is uniform in the thickness direction. Hereinafter, the carrier concentration of the silicon carbide substrate 1 is also referred to as "first carrier concentration $N_{SUB}$." The epitaxial layer 3 has a carrier concentration which is uniform in the thickness direction. The epitaxial layer 3 is often used as a drift layer. Hereinafter, the carrier concentration of the epitaxial layer 3 is referred to as "second carrier concentration $N_{EP}$." When the silicon carbide substrate for power device applications is of an N-type, the silicon carbide substrate generally has a carrier concentration on the order of $10^{18}$ to $10^{19}$ cm$^{-3}$. The first carrier concentration $N_{SUB}$ of the silicon carbide substrate 1 is also $10^{18}$ to $10^{19}$ cm$^{-3}$. The second carrier concentration $N_{EP}$ has a carrier concentration on the order of $10^{15}$ to $10^{16}$ cm$^{-3}$. For power device applications, it is common that the first carrier concentration $N_{SUB}$ has a carrier concentration about 10 to 1000 times higher than the second carrier concentration $N_{EP}$.

Figure 3:
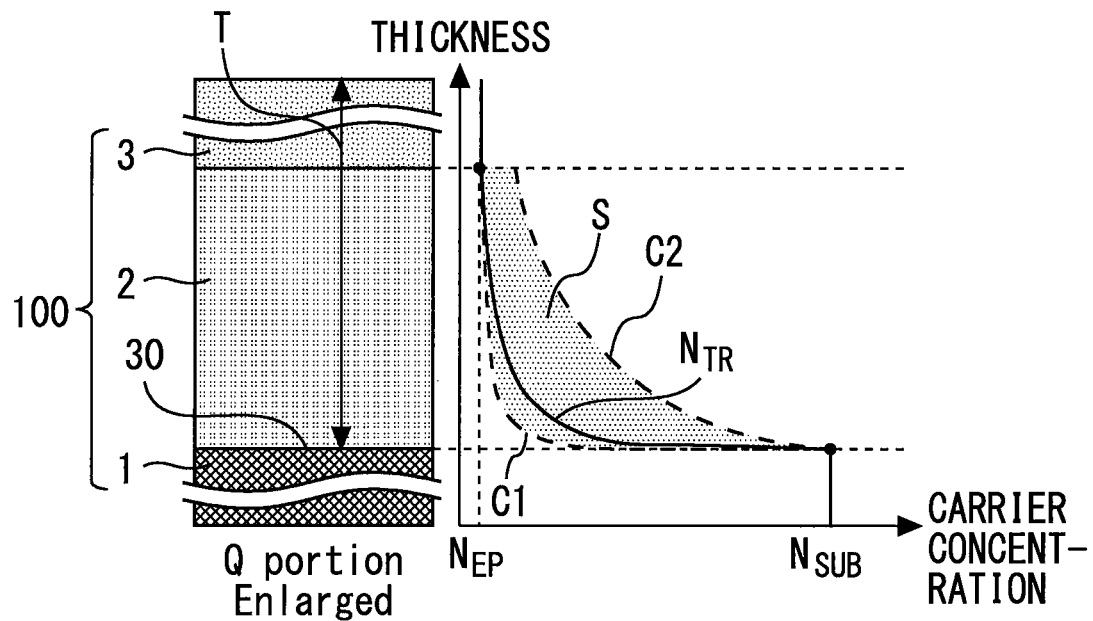
FIG. 3 is a partially enlarged view of the silicon carbide wafer according to the embodiment of the present invention and is a graph illustrating a carrier concentration distribution.

FIG. 3 is a partially enlarged view of the silicon carbide wafer according to the embodiment of the present invention and is a graph illustrating a carrier concentration distribution. The layer structure of the silicon carbide wafer 100 shown on the left side of the sheet surface in FIG. 3 is an enlarged view of a Q portion in FIG. 2. An interface 30 is the interface between the carrier concentration transition layer 2 and the silicon carbide substrate 1. The graph shown on the right side of the sheet surface in FIG. 3 is a carrier concentration distribution shown in association with positions in the layer structure of the silicon carbide wafer 100 shown adjacently in the form of a graph.

The carrier concentration of the carrier concentration transition layer 2 has a concentration gradient in the thickness direction of the carrier concentration transition layer 2. Hereinafter, the carrier concentration of the carrier concentration transition layer 2 is also called "carrier concentration $N_{TR}$." The concentration gradient of the carrier concentration $N_{TR}$ is such a gradient that the carrier concentration value decreases continuously as the film thickness increases from the interface between a layer directly below the carrier concentration transition layer 2 and the carrier concentration transition layer 2. In the graph shown in FIG. 3, the carrier concentration $N_{TR}$ shows a curved carrier concentration change. According to the present embodiment, the carrier concentration value decreases as the film thickness from the interface 30 increases. In the silicon carbide wafer 100, the layer directly below the carrier concentration transition layer 2 is the silicon carbide substrate 1. Furthermore, the concentration gradient of the carrier concentration $N_{TR}$ is such a gradient that the carrier concentration value decreases at a lower rate of decrease as the distance from the interface 30 increases. Therefore, at the interface 30 side, the carrier concentration value decreases at a greater rate as the film thickness increases and the carrier concentration decreases more gently as the distance from the interface between the carrier concentration transition layer 2 and the epitaxial layer 3 decreases. Note that although the carrier concentration transition layer 2 according to the present embodiment has a concentration gradient in the thickness direction, it has a uniform concentration in the plane direction of the silicon carbide wafer 100. That is, the carrier concentration is constant within the plane of a cross section obtained by cutting the carrier concentration transition layer 2 at a given thickness position.

Note that terms "layer directly below" and "layer directly on" are used in the present embodiment. The "layer directly below" means a case where a specific layer is in direct contact with a layer therebelow without any other semiconductor layer interposed therebetween. In the silicon carbide wafer 100, since the carrier concentration transition layer 2 has epitaxially grown directly on the silicon carbide substrate 1, the layer directly below the carrier concentration transition layer 2 is the silicon carbide substrate 1. The "layer directly on" means a case where a specific layer is in direct contact with a layer directly thereon without any other semiconductor layer interposed therebetween. In the silicon carbide wafer 100, since the epitaxial layer 3 has epitaxially grown directly on the carrier concentration transition layer 2, the layer directly on the carrier concentration transition layer 2 is the epitaxial layer 3.

It is clear from experiment results that the carrier concentration of the epitaxial layer is in proportion to a nitrogen flow rate during epitaxial growth and is in inverse proportion to the epitaxial growth rate. Taking advantage of this respect, the present inventor solved the following equations (1) to (4).

$$Nd-Na(t)=N(t)/G(t) \times N_c \qquad (1)$$

$$N(t)=N_f+N_0-N_f/t_{buf} \times t \qquad (2)$$

$$G(t)=(G_m-G_i)/t_{buf} \times t+G_i \qquad (3)$$

$$T=\int G(t)dt \qquad (4)$$

Solving the aforementioned four equations gives the following equation (5).

$$Nd-Na(T)=(A'/(B'+C' \times T)^{1/2}-D') \times E' \qquad (5)$$

Here, the above-described various parameters represent the following parameters relating to the carrier concentration transition layer 2. Nd−Na means a carrier concentration. Parameter t represents a time from the start of growth. N(t) is a nitrogen flow rate at the time of growth time t. G(t) is a growth rate at the time of growth time t. $N_c$ is a constant that defines inclusion of nitrogen into the epitaxial layer. Parameter $t_{buf}$ is a growth time of the carrier concentration transition layer 2. $N_i$ is a nitrogen flow rate when the growth of the carrier concentration transition layer 2 is started (t=0). $N_0$ is a nitrogen flow rate when the growth of the carrier concentration transition layer 2 ends (t=$t_{buf}$). $G_i$ is a growth rate when the growth of the carrier concentration transition layer 2 starts (t=0). $G_m$ is a growth rate when the growth of the carrier concentration transition layer 2 ends (t=$t_{buf}$). T is a thickness of the carrier concentration transition layer 2.

The thickness of the carrier concentration transition layer 2 when t=$t_{buf}$ is expressed by the following equation (6).

$$T_{buf} = G_i \times t_{buf} + (G_m + G_i) \times t_{buf}/2 \quad (6)$$

When Nd−Na is assumed to be a variable of ratio $T/T_{buf}$ of the carrier concentration transition layer 2, the following equation (7) is obtained.

$$Nd-Na(T/T_{buf}) = (A/(B+C \times T/T_{buf})^{1/2} - D) \times E \quad (7)$$

The carrier concentration of the carrier concentration transition layer 2 when the growth of the carrier concentration transition layer 2 starts is also called a "carrier concentration initial value." The carrier concentration initial value of the carrier concentration transition layer 2 is denoted as $Nd-Na(T/T_{buf}=0)$. Since $Nd-Na(T/T_{buf}=0)$ is a constant, the following equation (8) can be derived.

$$Nd-Na(T/T_{buf})/Nd-Na(T/T_{buf}=0) = A/(B+C \times T/T_{buf})^{1/2} - D \quad (8)$$

Ni, $N_0$, Gi, Gm and $N_c$ are constants. A', B', C', D', E', A, B, C and D are also constants. The constants A' to D are composed of constants Ni to Nc.

Hereinafter, the "film thickness ratio" and the "carrier concentration ratio" are defined as shown in the following equation (9) and equation (10) using characters Y and X:

$$Y = (Nd-Na(T/T_{buf})/Nd-Na(T/T_{buf}=0) \quad (9)$$

$$X = T/T_{buf} \quad (10)$$

X is a "film thickness ratio" in the carrier concentration transition layer 2. The film thickness ratio is obtained by dividing the thickness of the carrier concentration transition layer 2 in the middle of growth after starting the growth of the carrier concentration transition layer 2 by a film thickness design value of the carrier concentration transition layer 2. This film thickness design value is a target film thickness of the carrier concentration transition layer 2 in a production step. The film thickness of the carrier concentration transition layer 2 after completion of the silicon carbide wafer 100 can be regarded as the same film thickness design value of the carrier concentration transition layer 2. X is a variable and the domain of X is 0≤X≤1. When X=1, this means the thickness of the carrier concentration transition layer 2 when the silicon carbide wafer 100 is completed, that is, a 100% thickness. When X=0.5, this means just half the thickness of the carrier concentration transition layer 2, that is, a 50% thickness. In the silicon carbide wafer 100 provided as a finished product, X is a value obtained by dividing any given position along the thickness direction of the carrier concentration transition layer 2 by the film thickness design value of the carrier concentration transition layer 2.

Y is a "carrier concentration ratio" in the carrier concentration transition layer 2. The carrier concentration ratio is obtained by dividing the carrier concentration in the film thickness range of 0<X≤1 in the carrier concentration transition layer 2 by the carrier concentration of the carrier concentration transition layer 2 when X=0.

When A=1.05, B=1.74×10⁻³, C=1.00 and D=1.04 are substituted into the following equation (11), a first concentration gradient condition C1 is obtained. When A=1.95, B=1.11×10⁻¹, C=0.89 and D=1.50 are further substituted into the following equation (11), a second concentration gradient condition C2 is obtained. A gradient of a carrier concentration $N_{TR}$ of the carrier concentration transition layer 2 is set in advance within a predetermined concentration range S between this first concentration gradient condition C1 and the second concentration gradient condition C2. The predetermined concentration range S is a hatching region in FIG. 3.

[Math. 5]

$$Y = \frac{A}{\sqrt{B + C \times X}} - D \quad (11)$$

More specifically, the carrier concentration gradient of the carrier concentration transition layer 2 is set within the predetermined concentration range S between the first concentration gradient condition C1 defined by equation (12) and the second concentration gradient condition C2 defined by equation (13).

[Math. 6]

$$Y = \frac{1.05}{\sqrt{1.74 \times 10^{-3} + 1.00 \times X}} - 1.04 \quad (12)$$

[Math. 7]

$$Y = \frac{1.95}{\sqrt{1.11 \times 10^{-1} + 0.89 \times X}} - 1.50 \quad (13)$$

With the provision of the carrier concentration transition layer 2 according to the present embodiment, the following various effects can be obtained. Particularly, a concentration gradient is set for the carrier concentration transition layer 2 within the predetermined concentration range S in the present embodiment. The predetermined concentration range S is determined so as to satisfy both the first concentration gradient condition C1 and the second concentration gradient condition C2. The first concentration gradient condition C1 is a condition necessary to keep crystallinity in good conditions to thereby prevent deterioration of device characteristics. The second concentration gradient condition C2 is a condition necessary to measure a film thickness using the FT-IR method.

A first advantageous effect is the ability to gradually decrease lattice constant differences between a high carrier concentration region with a small lattice constant and a low carrier concentration region with a large lattice constant as the film thickness of the carrier concentration transition layer 2 increases. If no carrier concentration transition layer 2 is provided, considerable stress must be applied to the interface between the high carrier concentration region and the low carrier concentration region. The carrier concentration transition layer 2 relaxes this stress, and can thereby suppress dislocations and crystal defect failures that may occur during epitaxial growth. Particularly, the first concentration gradient condition C1 is provided in the present embodiment. As a result, the carrier concentration transition layer 2 can have a concentration gradient provided with a degree of gentleness minimum necessary for suppression of dislocations and crystal defect failures.

Another effect is an advantage when using a power semiconductor device produced using the silicon carbide wafer 100, for example, semiconductor devices 40 and 42, which will be described later, by turning on power to the semiconductor devices 40 and 42. Since stress at the interface 30 between the carrier concentration transition layer 2 and the silicon carbide substrate 1 is relaxed, it is possible to suppress occurrences of dislocations at the interface 30. If no carrier concentration transition layer 2 is provided, stress is generated at the interface between the silicon carbide substrate 1 having a high carrier concentration and the epitaxial layer 3 having a low carrier concentration due to energy when power is turned on after the production of the power semiconductor device, and dislocations and crystal defect failures caused by this stress may cause degradation of the crystal quality. In this respect, the present inventor has confirmed that when the carrier concentration transition layer 2 is provided, dislocations and crystal defect failures are suppressed at the interface 30 between the silicon carbide substrate 1 having a high carrier concentration and the carrier concentration transition layer 2 having a low carrier concentration even when power to the power semiconductor device is turned on. Note that in the case where the layer directly below the carrier concentration transition layer 2 is another epitaxial layer as in the case of a modification which will be described later, it is possible to obtain a stress relaxation effect at the interface between the carrier concentration transition layer 2 and the other epitaxial layer.

A further effect is the ability to generate a sufficiently large carrier concentration difference at the interface 30 between the silicon carbide substrate 1 and the carrier concentration transition layer 2. As a result, it is possible to perform interface detection based on the FT-IR method. Therefore, the epitaxial film thickness can be measured accurately using the FT-IR method. That is, it is possible to accurately measure a thickness T in FIG. 3 using the FT-IR method. The thickness of the epitaxial film can also be measured by separating the epitaxial layer 3.

A still further effect is the ability to prevent a drastic change of the flow rate of the dopant gas in the formation step of the carrier concentration transition layer 2. It is thereby possible to form the carrier concentration transition layer 2 while suppressing crystal defect failures. Details in this respect will be described in the "producing method according to the embodiment" which will be described later.

Figure 4:
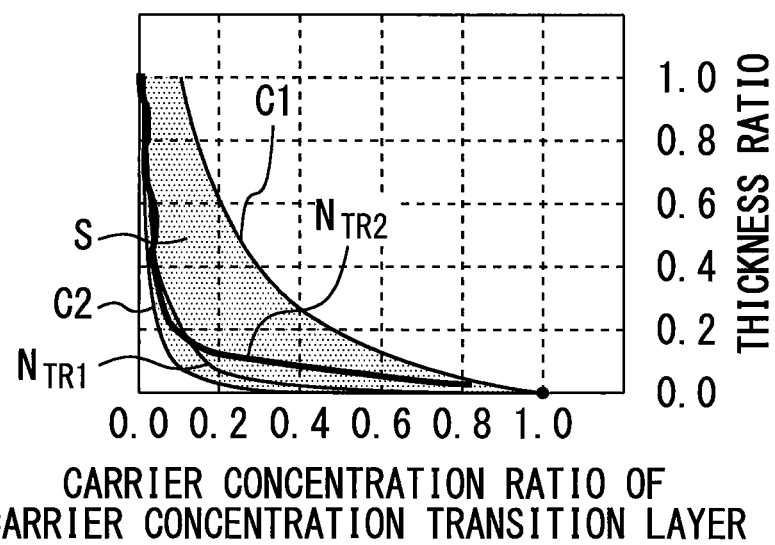
FIG. 4 is a graph for describing a predetermined concentration range of the carrier concentration transition layer according to the embodiment of the present invention.

FIG. 4 is a graph for describing a predetermined concentration range S of the carrier concentration transition layer 2 according to the embodiment of the present invention. As shown in FIG. 4, concentration gradients of various shapes and gradients can be set as long as they are continuous concentration gradients that fall within the predetermined concentration range S. Instead of the carrier concentration $N_{TR}$ in FIG. 3, a carrier concentration $N_{TR1}$ or a carrier concentration $N_{TR2}$ in FIG. 4 may also be used.

Regarding the carrier concentration range of the carrier concentration transition layer 2, the range can also be modified as follows. The predetermined concentration range S may also be defined under the following third concentration gradient condition and fourth concentration gradient condition instead of the aforementioned first concentration gradient condition and second concentration gradient condition. The third concentration gradient condition can be obtained by substituting A=1.08, B=4.45×10⁻³, C=1.00 and D=1.07 into equation (11). Equation (14) below shows the third concentration gradient condition. The fourth concentration gradient condition can be obtained by substituting A=1.60, B=2.78×10⁻², C=0.97 and D=1.20 into equation (11). Equation (15) below shows the fourth concentration gradient condition. This allows a stress relaxation effect at the interface, an interface detection effect using the FT-IR method and competitive advantages in production scenes to be enhanced even more.

[Math. 8]

$$Y = \frac{1.08}{\sqrt{4.45 \times 10^{-3} + 1.00 \times X}} - 1.07 \quad (14)$$

[Math. 9]

$$Y = \frac{1.60}{\sqrt{2.78 \times 10^{-2} + 0.97 \times X}} - 1.20 \quad (15)$$

The following range can also be set for the thickness of the carrier concentration transition layer 2. When the thickness $T_{buf}$ of the carrier concentration transition layer 2 is larger than 10 μm, a sufficient crystal defect failure reduction effect can be obtained. However, when the gradient of the carrier concentration is insufficient, the amount of infrared reflected light at the interface 30 decreases and FT-IR measurement of the epitaxial film thickness may become more difficult. On the other hand, when the carrier concentration transition layer 2 is thinner than 0.3 μm, the stress relaxation effect decreases. Therefore, a preferable film thickness of the carrier concentration transition layer 2 is within a range of 0.3 μm to 10 μm. The film thickness of the carrier concentration transition layer 2 more preferably falls within a range of 0.5 μm to 3 μm and still more preferably falls within a range of 1 μm to 3 μm.

The following range may also be set for the carrier concentration initial value of the carrier concentration transition layer 2.

First, a lower limit of the carrier concentration initial value will be examined. A lattice constant of silicon carbide depends on a carrier concentration; the higher the carrier concentration, the smaller the lattice constant becomes. When the carrier concentration initial value of the carrier concentration transition layer 2 is smaller than 1×10¹⁷ cm⁻³, since the lattice constant difference between the epitaxial layer 3 and the carrier concentration transition layer 2 is small, an increase of a crystal defect failure is not a so big problem. When the carrier concentration initial value of the carrier concentration transition layer 2 is 1×10¹⁷ cm⁻³ or greater, the lattice constant difference between the epitaxial layer 3 and the carrier concentration transition layer 2 increases, the technical merit of the silicon carbide wafer 100 according to the present embodiment is high. Furthermore, when the carrier concentration initial value of the carrier concentration transition layer 2 is higher than 2×10¹⁹ cm⁻³, the lattice constant difference between the epitaxial layer 3 and the carrier concentration transition layer 2 becomes excessively large and the technical merit of the silicon carbide wafer 100 according to the present embodiment is still higher.

Next, an upper limit of the carrier concentration initial value will be examined. When the carrier concentration of the silicon carbide substrate 1 is 2×10¹⁹ cm⁻³ or higher, the number of dislocations and crystal defect failures within the silicon carbide substrate 1 drastically increases. Therefore, the carrier concentration of the silicon carbide substrate 1 is actually limited to $2\times10^{19}$ cm$^{-3}$ or less. As a result, in the case of the silicon carbide wafer 100, the carrier concentration initial value of the carrier concentration transition layer 2 made to grow on the silicon carbide substrate 1 is also limited to $2\times10^{19}$ cm$^{-3}$ or less, the same as the carrier concentration of the silicon carbide substrate 1.

Based on these examinations of the upper and lower limits, the carrier concentration initial value of the carrier concentration transition layer 2 preferably falls within a range of $1\times10^{17}$ cm$^{-3}$ to $2\times10^{19}$ cm$^{-3}$ in order to benefit from the technical merit of the silicon carbide wafer 100 according to the present embodiment. Furthermore, considering the carrier concentration of the silicon carbide substrate 1 for a normal silicon carbide power semiconductor device, the carrier concentration initial value of the carrier concentration transition layer 2 is more preferably set to within a range of $1\times10^{18}$ cm$^{-3}$ to $7\times10^{18}$ cm$^{-3}$.

The structure of the silicon carbide wafer 100 can further be transformed as described below. FIG. 5 to FIG. 8 are partially enlarged views and graphs illustrating a carrier concentration distribution of the silicon carbide wafers 101 to 104 according to modifications to the embodiment of the present invention. Note that the carrier concentration distribution diagrams shown in FIG. 5 to FIG. 8 are schematic graphs shown for reference and simplified to such an extent as to make it possible to distinguish the existence of a concentration gradient. Therefore, the actual inclination and curvature or the like of the graphs shown in FIG. 5 to FIG. 8 are not supposed to limit specific numerical values of the carrier concentration distribution.

Figure 5:
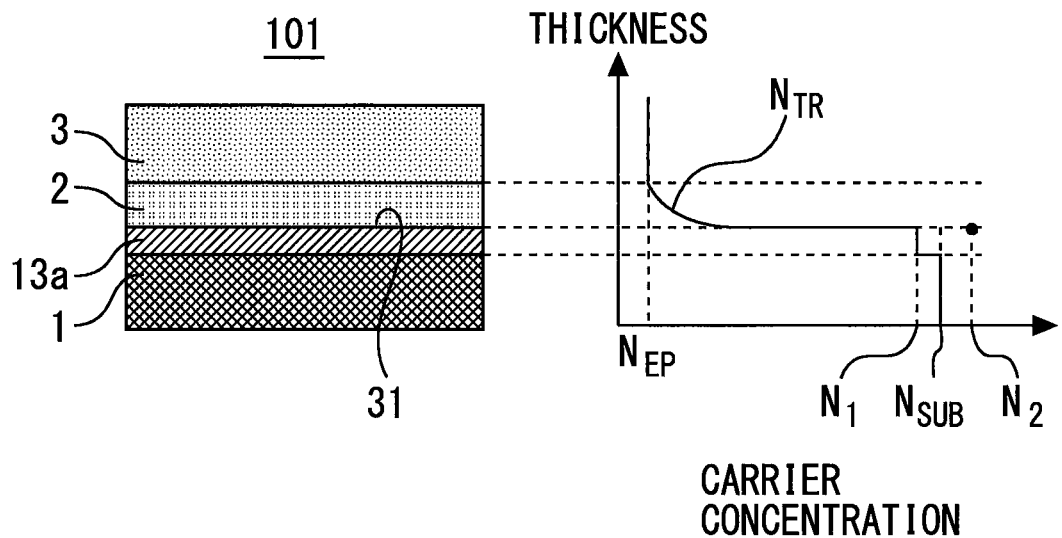
FIG. 5 is a partially enlarged view and a graph illustrating a carrier concentration distribution of the silicon carbide wafer according to modification to the embodiment of the present invention.

An epitaxial layer 13a may also be provided between the silicon carbide substrate 1 and the carrier concentration transition layer 2 as in the case of the silicon carbide wafer 101 shown in FIG. 5. The epitaxial layer 13a has a carrier concentration $N_1$ which is uniform in the thickness direction. The carrier concentration $N_1$ is lower than the first carrier concentration $N_{SUB}$ of the silicon carbide substrate 1 and higher than the second carrier concentration $N_{EP}$ of the epitaxial layer 3. The difference between the carrier concentration $N_1$ and the first carrier concentration $N_{SUB}$ may be such a concentration difference that the first carrier concentration $N_{SUB}$ is about 2 to 5 times higher than that of the carrier concentration $N_1$ as an example. However, the carrier concentration $N_1$ may be the same as the first carrier concentration $N_{SUB}$ as a modification. Furthermore, as another modification, the epitaxial layer 13a may also have a carrier concentration $N_2$ which is greater than the first carrier concentration $N_{SUB}$. In the modification in FIG. 5, it is also possible to obtain an effect of achieving both the crystallinity and measurement of a film thickness described in the aforementioned embodiment at the interface 31 between the epitaxial layer 13a directly below the carrier concentration transition layer 2 and the carrier concentration transition layer 2. Note that it is preferable that the carrier concentration $N_1$ of the epitaxial layer 13a directly below the carrier concentration transition layer 2 be 10 to 1000 times higher than the second carrier concentration $N_{EP}$ of the epitaxial layer 3 directly on the carrier concentration transition layer 2. This is because it is thereby possible to further make the most of technical advantages of the carrier concentration transition layer 2.

Figure 6:
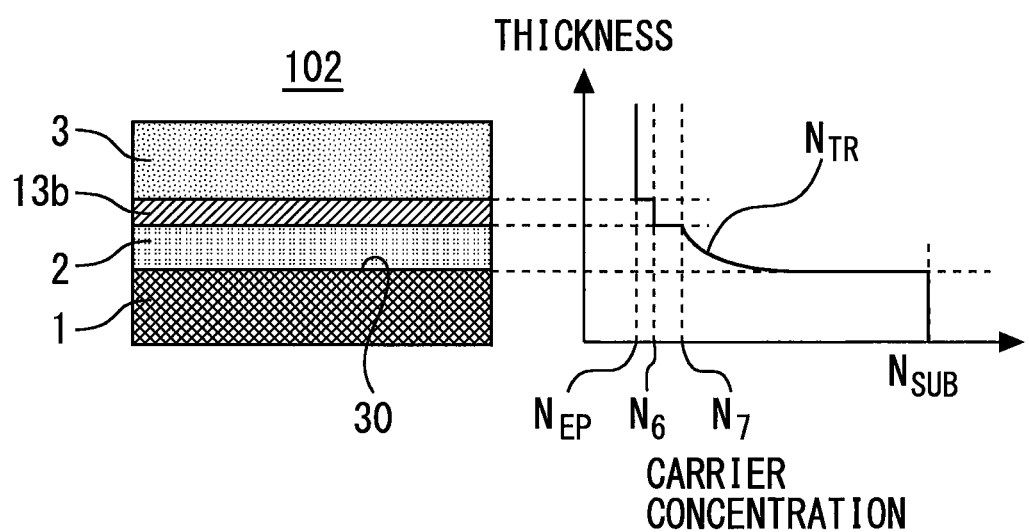
FIG. 6 is a partially enlarged view and a graph illustrating a carrier concentration distribution of the silicon carbide wafer according to modification to the embodiment of the present invention.

As the silicon carbide wafer 102 shown in FIG. 6, an epitaxial layer 13b may also be provided between the carrier concentration transition layer 2 and the epitaxial layer 3. The epitaxial layer 13b has a carrier concentration $N_6$ which is uniform in the thickness direction. The carrier concentration $N_6$ is lower than a minimum value $N_7$ of the carrier concentration $N_{TR}$ of the carrier concentration transition layer 2 and higher than the second carrier concentration $N_{EP}$ of the epitaxial layer 3. The concentration difference between the second carrier concentration $N_{EP}$ and a carrier concentration $N_6$ may be such a concentration difference that the carrier concentration $N_6$ is about 2 to 5 times higher than the second carrier concentration $N_{EP}$ as an example. The concentration difference between the minimum value $N_7$ of the carrier concentration $N_{TR}$ and the carrier concentration $N_6$ may be such a concentration difference that the minimum value $N_7$ is about 2 to 5 times higher than the carrier concentration $N_6$ as an example. However, as a modification, the carrier concentration $N_6$ may be the same as the second carrier concentration $N_{EP}$ or may be the same as the minimum value $N_7$ of the carrier concentration $N_{TR}$. In the modification in FIG. 6, it is also possible to obtain the effect of achieving both the crystallinity and measurement of a film thickness at the interface 30 between the carrier concentration transition layer 2 and the silicon carbide substrate 1 described in the aforementioned embodiment. Note that it is preferable that the first carrier concentration $N_{SUB}$ of the silicon carbide substrate 1 directly below the carrier concentration transition layer 2 be 10 to 1000 times higher than the carrier concentration $N_6$ of the epitaxial layer 13b directly on the carrier concentration transition layer 2. This is because it is thereby possible to further make the most of technical advantages of the carrier concentration transition layer 2.

As a silicon carbide wafer 103 shown in FIG. 7, a plurality of carrier concentration transition layers 2a and 2b may also be provided between the silicon carbide substrate 1 and the epitaxial layer 3. More specifically, the first carrier concentration transition layer 2a and the second carrier concentration transition layer 2b are placed one on top of the other in the silicon carbide wafer 103. The first carrier concentration transition layer 2a is a layer made to epitaxially grow on the silicon carbide substrate 1, and can be designed and produced just like the carrier concentration transition layer 2. However, a carrier concentration minimum value $N_3$ of the first carrier concentration transition layer 2a is higher than the second carrier concentration $N_{EP}$ of the epitaxial layer 3. The carrier concentration initial value of the second carrier concentration transition layer 2b coincides with the carrier concentration minimum value $N_3$ of the first carrier concentration transition layer 2a. The carrier concentration of the second carrier concentration transition layer 2b decreases as the film thickness increases and becomes the same second carrier concentration $N_{EP}$ of the epitaxial layer 3 at a maximum film thickness.

Both concentration gradients of the first carrier concentration transition layer 2a and the second carrier concentration transition layer 2b may be set so as to fall within the predetermined concentration range S as in the case of the carrier concentration transition layer 2 according to the embodiment. However, the concentration gradient of the first carrier concentration transition layer 2a may be different from the concentration gradient of the second carrier concentration transition layer 2b as long as the respective concentrations fall within the predetermined concentration range S. The silicon carbide wafer 103 in FIG. 7 can also obtain the effect of achieving both the crystallinity and measurement of the film thickness as described in the aforementioned embodiment at the interface 30 between the first carrier concentration transition layer 2a and the silicon carbide substrate 1. It is also possible to obtain the effect of achieving both the crystallinity and measurement of the film thickness as described in the aforementioned embodiment at the interface 32 between the second carrier concentration transition layer 2b and the first carrier concentration transition layer 2a.

As a more preferable modification, the concentration gradient of at least one of the first carrier concentration transition layer 2a and the second carrier concentration transition layer 2b may be set so as to fall within the predetermined concentration range defined by the third concentration gradient condition and the fourth concentration gradient condition.

Note that only the concentration gradient of only one of the first carrier concentration transition layer 2a and the second carrier concentration transition layer 2b may be set so as to fall within the predetermined concentration range S as in the case of the carrier concentration transition layer 2 according to the embodiment. It is possible to obtain the effect of achieving both the crystallinity and measurement of the film thickness described in the aforementioned embodiment at the interface between a layer directly below this one carrier concentration transition layer and this one carrier concentration transition layer. The other layer of the first carrier concentration transition layer 2a and the second carrier concentration transition layer 2b may have a concentration gradient that does not fall within the predetermined concentration range S.

As in the case of a silicon carbide wafer 104 shown in FIG. 8, an intermediate epitaxial layer 14 may also be provided between the first carrier concentration transition layer 2a and the second carrier concentration transition layer 2b. The intermediate epitaxial layer 14 includes an intermediate carrier concentration $N_4$ which is uniform in the thickness direction. The intermediate carrier concentration $N_4$ is lower than a carrier concentration minimum value $N_5$ of the first carrier concentration transition layer 2a and is equal to the carrier concentration initial value of the second carrier concentration transition layer 2b. A concentration difference between the intermediate carrier concentration $N_4$ and the minimum value $N_5$ may be set to on the order of about 2 to 5 times as an example. In the modification in FIG. 8, it is also possible to obtain the effect of achieving both the crystallinity and measurement of the film thickness described in the aforementioned embodiment at the interface 30 between the first carrier concentration transition layer 2a and the silicon carbide substrate 1 and at an interface 33 between the second carrier concentration transition layer 2b and the intermediate epitaxial layer 14.

Note that in the modification in FIG. 8, it is preferable that the first carrier concentration $N_{SUB}$ of the silicon carbide substrate 1 directly below the first carrier concentration transition layer 2a be 10 to 1000 times higher than the intermediate carrier concentration $N_4$ of the intermediate epitaxial layer 14 directly on the first carrier concentration transition layer 2a. Together with this or instead of this, it is preferable that the intermediate carrier concentration $N_4$ of the intermediate epitaxial layer 14 directly below the second carrier concentration transition layer 2b be 10 to 1000 times higher than the second carrier concentration $N_{EP}$ of the epitaxial layer 3 directly on the second carrier concentration transition layer 2b. This is because it is thereby possible to further make the most of technical advantages of the first carrier concentration transition layer 2a and the second carrier concentration transition layer 2b.

Note that though not shown, in addition, the epitaxial layer 13b in FIG. 6 may be added to the silicon carbide wafer 101 shown in FIG. 5. At least one of the epitaxial layers 13a and 13b in FIG. 5 and FIG. 6 may be added to the silicon carbide wafer 103 shown in FIG. 7. At least one of the epitaxial layers 13a and 13b in FIG. 5 and FIG. 6 may be added to the silicon carbide wafer 104 shown in FIG. 8.

Device Structure According to Embodiment

Figure 9:
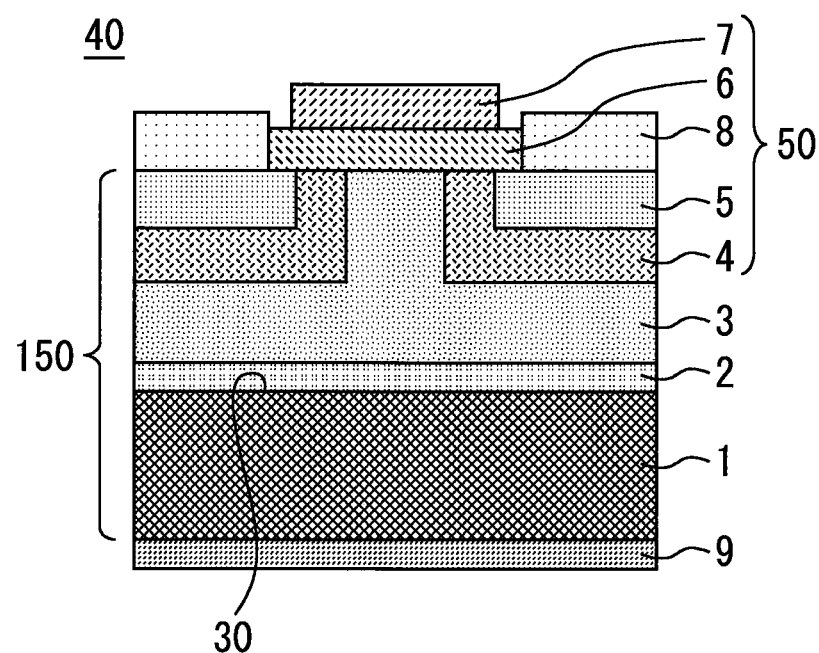
FIG. 9 is a diagram illustrating a semiconductor device according to the embodiment of the present invention.

FIG. 9 is a diagram illustrating a semiconductor device 40 according to the embodiment of the present invention. The semiconductor device 40 is a MOSFET (metal-oxide-semiconductor field-effect transistor). The semiconductor device 40 is constructed of a transistor surface structure 50 formed on a surface of a semiconductor chip 150 and a drain electrode 9 which is a rear side electrode provided on a rear side of the semiconductor chip 150. The semiconductor chip 150 has the same layer structure as the silicon carbide wafer 100 according to the embodiment. This is because the semiconductor chip 150 is obtained by dicing the silicon carbide wafer 100 in a so-called post-step treatment after forming the transistor surface structure 50 or the like. Therefore, the semiconductor chip 150 is provided with the silicon carbide substrate 1, the carrier concentration transition layer 2 and the drift layer 3. Here, since the epitaxial layer 3 is used as the drift layer 3, both layers are assigned the same reference numeral.

The transistor surface structure 50 is formed on the surface of the drift layer 3. The transistor surface structure 50 is more specifically provided with one set of base regions 4 formed by implanting impurities into the drift layer 3, source regions 5 formed in the one set of base regions respectively, a gate insulating film 6 formed so as to straddle one base region 4 and source region 5, and the other base region 4 and source region 5, a gate electrode 7 formed on the gate insulating film 6 and a source electrode 8 formed on the source regions 5.

A method for producing the semiconductor device 40 will be described. The silicon carbide wafer 100 is prepared and a mask is formed using a resist or the like in predetermined and mutually separated regions on the surface of the drift layer 3. After the mask is formed, impurities are ion-implanted. As a result, a pair of P-type base regions 4 are formed. Examples of the P-type impurities in the drift layer 3 include boron (B) or aluminum (Al). Furthermore, a mask is formed in the P-type base region 4 using a resist or the like, and the mask is removed after forming the N-type source regions 5. An example of N-type impurity is phosphor (P) or nitrogen (N). Next, after ion implantation, the wafer is subjected to heat treatment at a high temperature using a heat treatment apparatus. N-type and P-type implanted ions are electrically activated. The gate insulating film 6 is formed through thermal oxidation or deposition. The gate electrode 7 is formed on the gate insulating film 6 and patterned. The gate electrode 7 is provided so as to straddle the pair of base regions 4 and source regions 5. The gate electrode 7 is patterned so the center of the gate electrode 7 is located at the center of an exposed portion of the drift layer 3 exposed between the base regions 4. Furthermore, the residual portion of the gate insulating film 6 on each source region 5 is removed using a lithography technique and an etching technique. After the removal, the source electrode 8 is formed in the portion where the source region 5 is exposed and the source electrode 8 is patterned. The transistor surface structure 50 is thus completed. After that, the drain electrode 9 is formed on the rear side of the silicon carbide substrate 1. After these processes, the silicon carbide wafer 100 is diced into chips. As a result, the semiconductor device 40 having main parts of the MOSFET element structure shown in FIG. 9 is provided.

Note that the semiconductor device 40 is a MOSFET provided with a so-called planar gate-type insulating gate structure. However, the insulating gate structure of the semiconductor device 40 may have a so-called trench gate type structure. Furthermore, the insulating gate structure may be transformed into an insulating gate-type bipolar transistor (IGBT) by adding a P-type collector layer to the semiconductor device 40 or this IGBT may be of a trench gate type. Since these transformations are known techniques and not new ones, detailed description thereof will be omitted.

Figure 10:
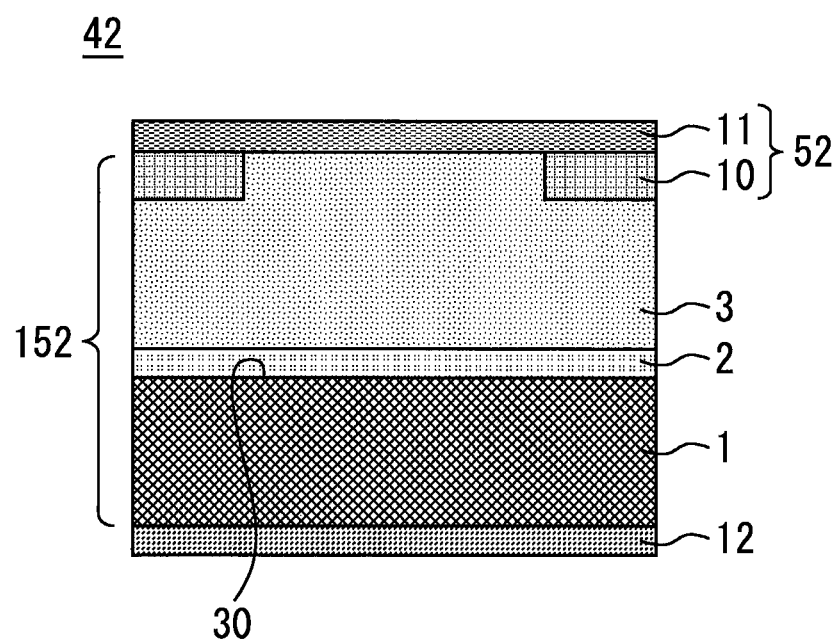
FIG. 10 is a diagram illustrating another semiconductor device according to the embodiment of the present invention.

FIG. 10 is a diagram illustrating another semiconductor device 42 according to the embodiment of the present invention. The semiconductor device 42 is a silicon carbide Schottky barrier diode (SiC-SBD). The semiconductor device 42 is constructed of an SBD surface structure 52 formed on a surface of a semiconductor chip 152 and an ohmic electrode 12 which is a rear side electrode provided on a rear side of the semiconductor chip 152. The semiconductor chip 152 has the same layer structure as the silicon carbide wafer 100 according to the embodiment. This is because the semiconductor chip 152 is obtained by dicing the silicon carbide wafer 100 in a so-called post-step treatment after forming the SBD surface structure 52 or the like. Therefore, the semiconductor chip 152 is provided with the silicon carbide substrate 1, the carrier concentration transition layer 2 and the drift layer 3. Here, since the epitaxial layer 3 is used as the drift layer 3, both layers are assigned the same reference numeral.

The SBD surface structure 52 is formed on the surface of the drift layer 3. More specifically, the SBD surface structure 52 is provided with one set of ion-implantation layers 10 formed on the drift layer 3 through impurity implantation and a Schottky electrode 11 formed so as to straddle this one set of ion-implantation layers 10. Note that the ion-implantation layer 10 is also called a "termination structure 10."

A method for producing the semiconductor device 42 will be described. The silicon carbide wafer 100 is prepared and a photoresist patterning mask of a desired pattern is formed on the surface of the drift layer 3. Impurity ions are implanted from above the mask and the ion-implantation layer 10 is formed on the surface of the N-type drift layer 3. After that, the mask and a sacrificial oxide film are removed. Activating annealing is performed to activate implanted impurity atoms and the P-type termination structure 10 is thereby formed. An ohmic electrode 12 is formed on the rear side of the silicon carbide substrate 1 and heat treatment is performed. Furthermore, the Schottky electrode 11 is formed on the surface of the silicon carbide substrate 1. After these processes, the silicon carbide wafer 100 is diced into chips. As a result, the semiconductor device 42 having main parts of the element structure shown in FIG. 10 is provided.

Note that although the semiconductor device 42 is a Schottky barrier diode, the semiconductor device 42 may also be a PN diode.

Note that all the aforementioned modifications of the silicon carbide wafer 100 according to the present embodiment are applied to the semiconductor chips 150 and 152 of the semiconductor devices 40 and 42. That is, the transistor surface structure 50 or the like or SBD surface structure 52 or the like may be formed on the silicon carbide wafer 100 to which the aforementioned various modifications are applied, and the silicon carbide wafer 100 may then be diced into chips. Furthermore, the silicon carbide wafers 101 to 104 may also be used instead of the silicon carbide wafer 100.

Producing Method According to Embodiment

Figure 11:
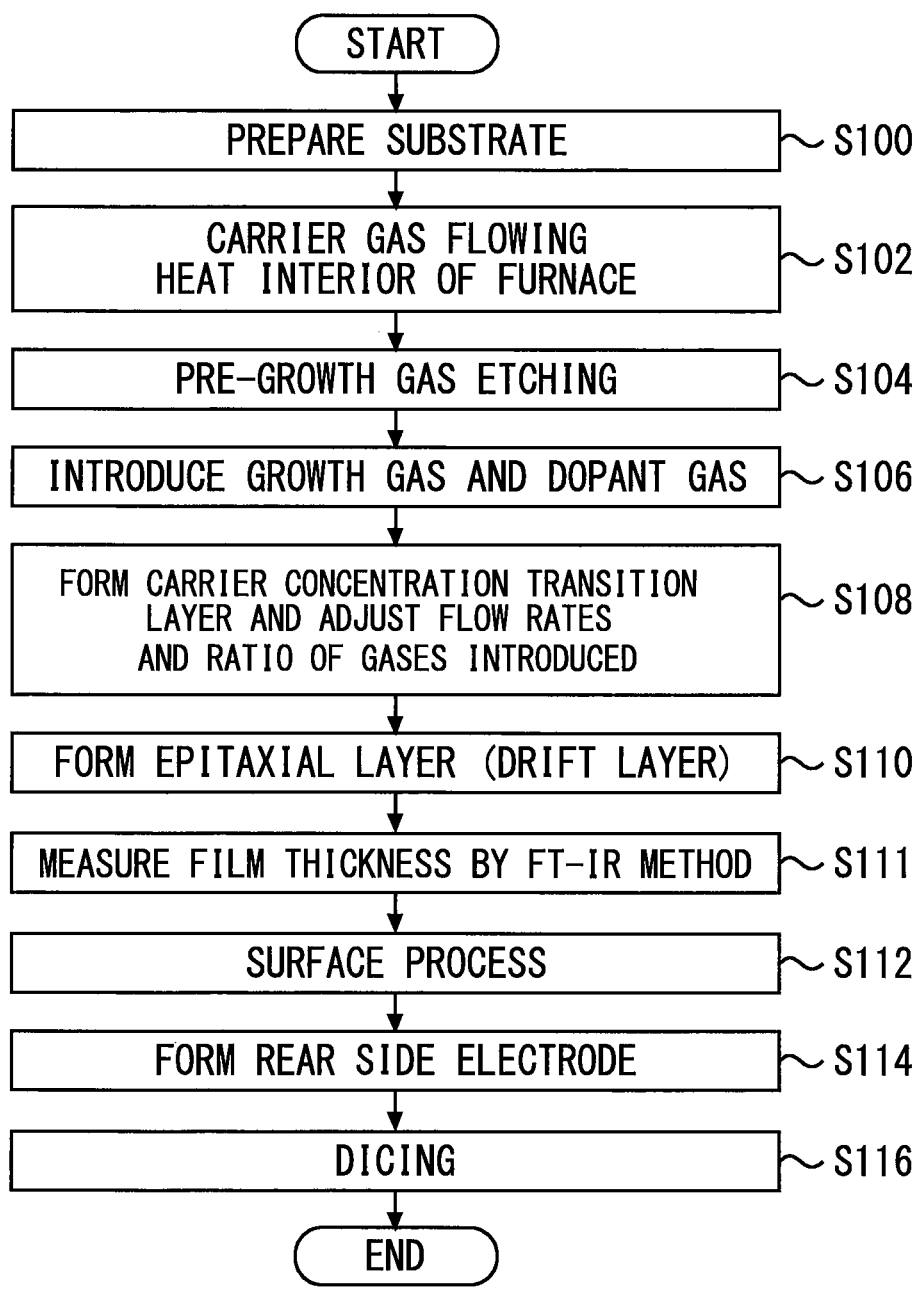
FIG. 11 is a flowchart illustrating a method for producing the semiconductor device according to the embodiment of the present invention.

FIG. 11 is a flowchart illustrating a method for producing the semiconductor device according to the embodiment of the present invention.

(Step S100)
An N-type silicon carbide substrate 1 having an off angle of 4° is prepared. The silicon carbide substrate 1 is disposed in the silicon carbide epitaxial apparatus.

(Step S102)
A hydrogen gas as a carrier gas is made to flow into the silicon carbide epitaxial apparatus. A temperature in a furnace of the silicon carbide epitaxial apparatus is raised to a predetermined temperature. The predetermined temperature is, for example, 1450° C. to 1650° C.

(Step S104)
After the temperature in the furnace reaches the predetermined temperature, this predetermined temperature is kept for a predetermined time and etching is performed using a gas before epitaxial growth.

(Step S106)
After performing etching using the gas, a growth gas and a dopant gas are introduced to start growth of the carrier concentration transition layer 2. As the growth gas, for example, silane-based gas such as mono-silane or a hydrocarbon-based gas such as propane may be used. As the dopant gas, for example, nitrogen may be used. Note that during etching and crystal growth, a chlorine-based gas such as hydrogen chloride may be introduced into the silicon carbide epitaxial apparatus.

(Step S108)
During the growth of the carrier concentration transition layer 2, the flow rate and ratio of mono-silane and propane, and the nitrogen flow rate are adjusted so that a desired carrier concentration is achieved. As an example, a mono-silane flow rate of 20 ccm, a propane flow rate of 7 ccm, a C/Si ratio of 1.05, and a nitrogen flow rate of 100 ccm may be adopted. In the present embodiment, a concentration change of the carrier concentration transition layer 2 is realized by continuously changing the gas flow rate. The carrier concentration transition layer 2 is obtained by continuously increasing the mono-silane flow rate over time during the growth of the carrier concentration transition layer 2 and at the same time continuously decreasing the nitrogen flow rate over time. As an example, mono-silane may be increased from 20 ccm to 160 ccm and propane may be increased from 7 ccm to 56 ccm for 300 seconds each. Simultaneously with this increase, nitrogen flow rate may be decreased from 100 ccm to 10 ccm for 300 seconds. The increase in the flow rate of the growth gas and the decrease in the flow rate of the dopant gas may be a linear, that is, linear-function-like change or may not be a completely linear but a curve, a ratio of flow rate change of which gently varies.

(Step S110)
In the present embodiment, after the carrier concentration transition layer 2 is made to grow in step S108, the epitaxial layer 3 is made to grow continuously. A growth condition of the epitaxial layer 3 may be, for example, mono-silane 160 ccm, propane 56 ccm and nitrogen 10 ccm. Since the epitaxial layer 3 has the second carrier concentration $N_{EP}$ which is uniform in the thickness direction, there is no necessity for providing any concentration gradient. Therefore, no proactive change such as a gas flow rate according to the passage of time like in step S108 is necessary. Note that it is also possible to suspend the epitaxial growth between the carrier concentration transition layer 2 and the epitaxial layer 3. However, in the case where the growth is suspended, there is a possibility that a crystal defect failure may be generated along with gas replacement. Therefore, adopting continuous growth without suspending the growth as in the case of the present embodiment is preferable from the standpoint of suppression of a crystal defect failure.
(Step S111)

After making the epitaxial layer 3 grow, a film thickness is measured using the FT-IR method. With the provision of the carrier concentration transition layer 2, it is possible to obtain infrared reflected light necessary for film thickness measurement based on the FT-IR method at the interface 30 between the carrier concentration transition layer 2 and the silicon carbide substrate 1.

At this point in time, it is possible to provide the silicon carbide wafer 100 improved so as to achieve both accurate film thickness management and excellent crystallinity. This silicon carbide wafer 100 may be sold as a product.
(Step S112)

In the embodiment, a surface process is further performed on the silicon carbide wafer 100 after step S111. The surface process is a step for forming the transistor surface structure 50 or the SBD surface structure 52. Since details of the surface process have already been described using FIG. 9 and FIG. 10, the detailed description is omitted here.
(Step S114)

Next, one of the drain electrode 9 and the ohmic electrode 12 which are rear side electrodes described in FIG. 9 and FIG. 10 is formed on the rear side of the silicon carbide wafer 100.
(Step S116)

After that, dicing is applied to the silicon carbide wafer 100. This is one of post-steps. The resulting chip product is the semiconductor device 40 shown in FIG. 9 or the semiconductor device 42 shown in FIG. 10.

The semiconductor devices 40 and 42 according to the present embodiment are provided in this way. A power semiconductor module may also be provided by packaging the semiconductor devices 40 and 42, mounting parts on the circuit substrate or the like and resin sealing after assembly into a case or mold resin sealing thereafter.

The method for producing a semiconductor device according to the present embodiment has the following advantages:

There are many deposits in the inner surface of a growth furnace of the silicon carbide epitaxial growth apparatus and parts in the growth furnace. There are also deposits having low adhesion with the inner surface of the growth furnace and parts in the growth furnace. With drastic gas replacement, if those deposits are whipped into the air and adhere to the silicon carbide wafer 100 this may cause a crystal defect failure. In addition, if overshoot or undershoot of the dopant gas flow rate occurs along with the gas flow rate control, it is difficult to stably obtain a desired dopant concentration. Caused by the overshoot or undershoot of the gas flow rate, the gas flow rate balance may be locally lost on the surface of the silicon carbide wafer 100. Particularly, the ratio of the silane-based gas or hydrocarbon-based gas is one of important conditions for the silicon carbide epitaxial growth. A local change of the gas flow rate balance on the surface of the silicon carbide wafer 100 may cause an increase of crystal defect failures and a bias of carrier concentration. In this respect, the present embodiment realizes a concentration change of the carrier concentration transition layer 2 through a continuous change of the gas flow rate. This prevents suspension of epitaxial growth during the growth of the carrier concentration transition layer 2 and eliminates the necessity for a drastic increase/decrease of the flow rate or replacement of growth gas or the like.

The process of producing a power semiconductor device includes an implantation step, an annealing step for donor activation and a film formation step for forming an electrode and an insulating film. Various thermal and mechanical forces are applied to the silicon carbide substrate 1 while undergoing these steps. In this respect, results of research conducted by the present inventor have confirmed that when the carrier concentration transition layer 2 is provided, it is possible to acquire the aforementioned suppression effects on dislocations and crystal defect failures in the process of producing the power semiconductor device.

Note that the above-described producing method may be modified in various ways. For example, nitrogen is used as the dopant gas in the embodiment. Instead of nitrogen, a mixed gas containing nitrogen and other elements may be used or another mixed gas containing an element which becomes an N-type dopant with respect to silicon carbide may be used. Furthermore, a dopant gas for P-type semiconductor formation may also be used. Although N-type semiconductors are used for the silicon carbide substrate 1 and the epitaxial layer 3 in the embodiment, P-type semiconductors may also be used for the silicon carbide substrate 1 and the epitaxial layer 3.

Note that modifications to the aforementioned silicon carbide wafer 100 according to the embodiment may be produced by modifying the flowchart shown in FIG. 11. For example, the carrier concentration and the setting of the film thickness of the carrier concentration transition layer 2 may be changed in various ways. For example, the silicon carbide wafers 101 to 104 shown in FIG. 5 to FIG. 8 may be produced as follows. To produce the silicon carbide wafer 101 shown in FIG. 5, a step of providing the epitaxial layer 13a may be added between step S106 and step S108 in FIG. 11. To produce the silicon carbide wafer 102 shown in FIG. 6, a step of providing the epitaxial layer 13b may be added between step S108 and step S110 in FIG. 11. To produce the silicon carbide wafer 103 shown in FIG. 7, step S108 in FIG. 11 may be repeated a plural number of times. However, set values of the carrier concentration and the film thickness need to be designed in accordance with the first carrier concentration transition layer 2a and the second carrier concentration transition layer 2b respectively. To produce the silicon carbide wafer 104 shown in FIG. 8, a step of providing the intermediate epitaxial layer 14 may be added after step S108 in FIG. 11, and step S108 may be further repeated before moving on to the next step.

REFERENCE SIGNS LIST 1 silicon carbide substrate
2 carrier concentration transition layer
2a first carrier concentration transition layer
2b second carrier concentration transition layer
3 epitaxial layer (drift layer)
13a, 13b epitaxial layer
4 base region
5 source region
6 gate insulating film
7 gate electrode
8 source electrode
9 drain electrode
10 ion-implantation layer (termination structure)
11 Schottky electrode
12 ohmic electrode
14 intermediate epitaxial layer
30~33 interface
40, 42 semiconductor device 50 transistor surface structure
52 SBD surface structure
100~404 silicon carbide wafer
150, 152 semiconductor chip
C1 first concentration gradient condition
C2 second concentration gradient condition

The invention claimed is:

1. A semiconductor wafer comprising:
   a silicon carbide substrate having a first carrier concentration which is uniform in a thickness direction;
   a carrier concentration transition layer provided on the silicon carbide substrate; and
   an epitaxial layer provided on the carrier concentration transition layer, the epitaxial layer having a second carrier concentration which is uniform in the thickness direction and the second carrier concentration being lower than the first carrier concentration, wherein
   the carrier concentration of the carrier concentration transition layer has a concentration gradient in the thickness direction,
   the concentration gradient is such a gradient that the carrier concentration decreases continuously as a distance along the thickness direction from an interface increases, the interface being provided between a layer directly below the carrier concentration transition layer and the carrier concentration transition layer, and the carrier concentration decreases at a lower rate of decrease as the distance from the interface along the thickness direction in the carrier concentration transition layer increases,
   X is a film thickness ratio in the carrier concentration transition layer,
   the film thickness ratio is obtained by dividing a position in the thickness direction of the carrier concentration transition layer by a film thickness of the carrier concentration transition layer,
   X is a variable having a domain of $0 \leq X \leq 1$,
   Y is a carrier concentration ratio in the carrier concentration transition layer,
   the carrier concentration ratio is obtained by dividing a carrier concentration of the carrier concentration transition layer in a range of $0 < X \leq 1$ by a carrier concentration of the carrier concentration transition layer when X=0, and
   when a concentration range lying between following equation (a1) and equation (a2) is defined in advance, $$Y = \frac{1.05}{\sqrt{1.74 \times 10^{-3} + 1.00 \times X}} - 1.04 \quad (a1)$$

$$Y = \frac{1.95}{\sqrt{1.11 \times 10^{-1} + 0.89 \times X}} - 1.50 \quad (a2)$$

the carrier concentration of the carrier concentration transition layer includes the concentration gradient that falls within the concentration range.

2. The semiconductor wafer according to claim 1, wherein when a concentration range lying between following equation (a3) and equation (a4) is defined in advance,

[Math. 3]

$$Y = \frac{1.08}{\sqrt{4.45 \times 10^{-3} + 1.00 \times X}} - 1.07 \quad (a3)$$

[Math. 4]

$$Y = \frac{1.60}{\sqrt{2.78 \times 10^{-2} + 0.97 \times X}} - 1.20 \quad (a4)$$

the carrier concentration of the carrier concentration transition layer includes a concentration gradient that falls within the concentration range lying between the equation (a3) and the equation (a4).

3. The semiconductor wafer according to claim 1, wherein the thickness of the carrier concentration transition layer falls within a range of 0.3 μm to 10.0 μm.

4. The semiconductor wafer according to claim 1, wherein
   a layer directly on the carrier concentration transition layer is the epitaxial layer,
   the layer directly below the carrier concentration transition layer is the silicon carbide substrate, and
   the first carrier concentration is 10 to 1000 times higher than the second carrier concentration.

5. The semiconductor wafer according to claim 1, wherein
   a layer directly on the carrier concentration transition layer is the epitaxial layer,
   another epitaxial layer having a third carrier concentration which is uniform in the thickness direction is provided between the silicon carbide substrate and the carrier concentration transition layer,
   the layer directly below the carrier concentration transition layer is the other epitaxial layer, and
   the third carrier concentration is 10 to 1000 times higher than the second carrier concentration.

6. The semiconductor wafer according to claim 1, wherein
   another epitaxial layer having a third carrier concentration which is uniform in the thickness direction is provided between the carrier concentration transition layer and the epitaxial layer,
   a layer directly on the carrier concentration transition layer is the other epitaxial layer,
   the layer directly below the carrier concentration transition layer is the silicon carbide substrate, and
   the first carrier concentration is 10 to 1000 times higher than the third carrier concentration.

7. The semiconductor wafer according to claim 1, wherein
   the carrier concentration transition layer is a first carrier concentration transition layer,
   a second carrier concentration transition layer is provided at least one location between the silicon carbide substrate and the first carrier concentration transition layer and between the first carrier concentration transition layer and the epitaxial layer,
   a carrier concentration of the second carrier concentration transition layer has a concentration gradient in the thickness direction, and
   the concentration gradient of the second carrier concentration transition layer is such a gradient that the carrier concentration continuously decreases as a distance along the thickness direction from another interface increases, the other interface being provided between a layer directly below the second carrier concentration transition layer and the second carrier concentration transition layer, and the carrier concentration decreases at a lower rate of decrease as the distance from the other interface along the thickness direction in the second carrier concentration transition layer increases.

8. A semiconductor device comprising:
a silicon carbide substrate having a first carrier concentration which is uniform in a thickness direction;
a carrier concentration transition layer provided on the silicon carbide substrate;
an epitaxial layer provided on the carrier concentration transition layer, the epitaxial layer having a second carrier concentration which is uniform in the thickness direction and the second carrier concentration being lower than the first carrier concentration;
a surface structure provided on a surface of the epitaxial layer, the surface structure including at least one of a transistor and a Schottky barrier diode, and
a rear side electrode provided on a rear side of the silicon carbide substrate,
wherein
the carrier concentration of the carrier concentration transition layer has a concentration gradient in the thickness direction,
the concentration gradient is such a gradient that the carrier concentration decreases continuously as a distance along the thickness direction from an interface increases, the interface being provided between a layer directly below the carrier concentration transition layer and the carrier concentration transition layer, and the carrier concentration decreases at a lower rate of decrease as the distance from the interface along the thickness direction in the carrier concentration transition layer increases,
X is a film thickness ratio in the carrier concentration transition layer,
the film thickness ratio is obtained by dividing a position in the thickness direction of the carrier concentration transition layer by a film thickness of the carrier concentration transition layer,
X is a variable having a domain of $0 \leq X \leq 1$,
Y is a carrier concentration ratio in the carrier concentration transition layer,
the carrier concentration ratio is obtained by dividing a carrier concentration of the carrier concentration transition layer in a range of $0 < X \leq 1$ by a carrier concentration of the carrier concentration transition layer when X=0, and
when a concentration range lying between a following equation (b1) and equation (b2) is defined in advance, $$Y = \frac{1.05}{\sqrt{1.74 \times 10^{-3} + 1.00 \times X}} - 1.04 \quad (b1)$$

$$Y = \frac{1.95}{\sqrt{1.11 \times 10^{-1} + 0.89 \times X}} - 1.50 \quad (b2)$$

the carrier concentration of the carrier concentration transition layer includes a concentration gradient that falls within the concentration range.

9. A method for producing a semiconductor device, comprising:
a first step of preparing a silicon carbide substrate having a first carrier concentration which is uniform in a thickness direction;
a second step of providing a carrier concentration transition layer provided on the silicon carbide substrate by supplying a growth gas and a dopant gas; and
a third step of providing an epitaxial layer provided on the carrier concentration transition layer, the epitaxial layer having a second carrier concentration which is uniform in the thickness direction and the second carrier concentration being lower than the first carrier concentration, wherein
the second step is configured to control flow rates of the growth gas and the dopant gas so that the carrier concentration of the carrier concentration transition layer has a concentration gradient in the thickness direction,
the concentration gradient is such a gradient that the carrier concentration decreases continuously as a distance along the thickness direction from an interface increases, the interface being provided between a layer directly below the carrier concentration transition layer and the carrier concentration transition layer, and the carrier concentration decreases at a lower rate of decrease as the distance from the interface along the thickness direction in the carrier concentration transition layer increases,
X is a film thickness ratio in the carrier concentration transition layer,
the film thickness ratio is obtained by dividing a thickness of the carrier concentration transition layer in a middle of growth after the carrier concentration transition layer starts to grow by a film thickness design value of the carrier concentration transition layer,
X is a variable having a domain of $0 \leq X \leq 1$,
Y is a carrier concentration ratio in the carrier concentration transition layer,
the carrier concentration ratio is obtained by dividing a carrier concentration of the carrier concentration transition layer in a range of $0 < X \leq 1$ by a carrier concentration of the carrier concentration transition layer when X=0, and
when a concentration range lying between a following equation (c1) and equation (c2) is defined in advance, $$Y = \frac{1.05}{\sqrt{1.74 \times 10^{-3} + 1.00 \times X}} - 1.04 \quad (c1)$$

$$Y = \frac{1.95}{\sqrt{1.11 \times 10^{-1} + 0.89 \times X}} - 1.50 \quad (c2)$$

the second step is configured to control the flow rates of the growth gas and the dopant gas so that the carrier concentration of the carrier concentration transition layer includes a concentration gradient that falls within the concentration range.

10. The method for producing a semiconductor device according to claim 9, wherein in the second step, the growth gas is continuously increased in accordance with a passage of time and the dopant gas is continuously decreased in accordance with the passage of time.

11. The method for producing a semiconductor device according to claim 9, wherein the carrier concentration transition layer and the epitaxial layer are made to grow continuously by continuing to introduce the growth gas and the dopant gas from the second step to the third step.

12. The semiconductor wafer according to claim 2, wherein the thickness of the carrier concentration transition layer falls within a range of 0.3 μm to 10.0 μm.

13. The semiconductor wafer according to claim 2 wherein
 a layer directly on the carrier concentration transition layer is the epitaxial layer,
 the layer directly below the carrier concentration transition layer is the silicon carbide substrate, and
 the first carrier concentration is 10 to 1000 times higher than the second carrier concentration.

14. The semiconductor wafer according to claim 3 wherein
 a layer directly on the carrier concentration transition layer is the epitaxial layer,
 the layer directly below the carrier concentration transition layer is the silicon carbide substrate, and
 the first carrier concentration is 10 to 1000 times higher than the second carrier concentration.

15. The semiconductor wafer according to claim 2, wherein
 a layer directly on the carrier concentration transition layer is the epitaxial layer,
 another epitaxial layer having a third carrier concentration which is uniform in the thickness direction is provided between the silicon carbide substrate and the carrier concentration transition layer,
 the layer directly below the carrier concentration transition layer is the other epitaxial layer, and
 the third carrier concentration is 10 to 1000 times higher than the second carrier concentration.

16. The semiconductor wafer according to claim 3, wherein
 a layer directly on the carrier concentration transition layer is the epitaxial layer,
 another epitaxial layer having a third carrier concentration which is uniform in the thickness direction is provided between the silicon carbide substrate and the carrier concentration transition layer,
 the layer directly below the carrier concentration transition layer is the other epitaxial layer, and
 the third carrier concentration is 10 to 1000 times higher than the second carrier concentration.

17. The semiconductor wafer according to claim 2, wherein
 another epitaxial layer having a third carrier concentration which is uniform in the thickness direction is provided between the carrier concentration transition layer and the epitaxial layer,
 a layer directly on the carrier concentration transition layer is the other epitaxial layer,
 the layer directly below the carrier concentration transition layer is the silicon carbide substrate, and
 the first carrier concentration is 10 to 1000 times higher than the third carrier concentration.

18. The semiconductor wafer according to claim 3, wherein
 another epitaxial layer having a third carrier concentration which is uniform in the thickness direction is provided between the carrier concentration transition layer and the epitaxial layer,
 a layer directly on the carrier concentration transition layer is the other epitaxial layer,
 the layer directly below the carrier concentration transition layer is the silicon carbide substrate, and
 the first carrier concentration is 10 to 1000 times higher than the third carrier concentration.

19. The semiconductor wafer according to claim 2, wherein
 the carrier concentration transition layer is a first carrier concentration transition layer,
 a second carrier concentration transition layer is provided at least one location between the silicon carbide substrate and the first carrier concentration transition layer and between the first carrier concentration transition layer and the epitaxial layer,
 a carrier concentration of the second carrier concentration transition layer has a concentration gradient in the thickness direction, and
 the concentration gradient of the second carrier concentration transition layer is such a gradient that the carrier concentration continuously decreases as a distance along the thickness direction from another interface increases, the other interface being provided between a layer directly below the second carrier concentration transition layer and the second carrier concentration transition layer, and the carrier concentration decreases at a lower rate of decrease as the distance from the other interface along the thickness direction in the second carrier concentration transition layer increases.

20. The method for producing a semiconductor device according to claim 10, wherein the carrier concentration transition layer and the epitaxial layer are made to grow continuously by continuing to introduce the growth gas and the dopant gas in the second step and the third step.

* * * * *